(12) United States Patent
Hirabayashi

(10) Patent No.: US 10,897,576 B2
(45) Date of Patent: Jan. 19, 2021

(54) CIRCUIT BOARD, ELECTRONIC APPARATUS, AND IMAGE FORMING APPARATUS

(71) Applicant: CANON KABUSHIKI KAISHA, Tokyo (JP)

(72) Inventor: Jun Hirabayashi, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/284,949

(22) Filed: Feb. 25, 2019

(65) Prior Publication Data

US 2019/0191095 A1 Jun. 20, 2019

Related U.S. Application Data

(63) Continuation of application No. 15/614,867, filed on Jun. 6, 2017, now Pat. No. 10,264,185.

(30) Foreign Application Priority Data

Jun. 30, 2016 (JP) ................................. 2016-130903

(51) Int. Cl.
| | | |
|---|---|---|
| *H01R 12/00* | (2006.01) | |
| *H05K 1/00* | (2006.01) | |
| *H04N 5/232* | (2006.01) | |
| *H01L 27/146* | (2006.01) | |
| *H04N 1/00* | (2006.01) | |

(Continued)

(52) U.S. Cl.
CPC ... *H04N 5/23293* (2013.01); *H01L 27/14609* (2013.01); *H04N 1/00408* (2013.01); *H04N 1/00461* (2013.01); *H04N 1/32122* (2013.01); *H04N 5/378* (2013.01)

(58) Field of Classification Search
CPC ..................... H01R 13/65802; H01R 13/6596; H01R 4/30; H01R 9/0512; H04N 5/378; H04N 1/32122; H04N 1/00408; H04N 1/00461; H01L 27/14609
USPC .............................................. 439/74, 95, 97
See application file for complete search history.

(56) References Cited

U.S. PATENT DOCUMENTS

| | | | |
|---|---|---|---|
| 4,249,302 A | 2/1981 | Crepeau | |
| 4,707,039 A * | 11/1987 | Whipple | ................. H01P 3/081 439/75 |
| 4,929,185 A | 5/1990 | Wong | |

(Continued)

FOREIGN PATENT DOCUMENTS

| | | |
|---|---|---|
| JP | S62-060100 U | 4/1987 |
| JP | 2001-125330 A | 5/2001 |

(Continued)

OTHER PUBLICATIONS

Japanese Office Action dated Aug. 18, 2020 in corresponding Japanese application No. 2016-130903 (with English language translation).

*Primary Examiner* — Hae Moon Hyeon
(74) *Attorney, Agent, or Firm* — Venable LLP

(57) ABSTRACT

The electronic apparatus includes a first circuit board on which a circuit mounted, a second circuit board arranged close to the circuit on the first circuit board, and a conductive terminal, which is in contact with a ground pattern on the first circuit board, and is arranged at a location between the circuit and the second circuit board so as to extend over the circuit.

19 Claims, 6 Drawing Sheets

(51) Int. Cl.
*H04N 1/32* (2006.01)
*H04N 5/378* (2011.01)

(56) References Cited

U.S. PATENT DOCUMENTS

| | | | |
|---|---|---|---|
| 5,380,211 A * | 1/1995 | Kawaguchi | H01R 4/30 439/74 |
| 6,611,429 B2 * | 8/2003 | Kline | H05K 9/0039 174/51 |
| 6,711,030 B2 * | 3/2004 | Akiba | H05K 3/368 174/262 |
| 6,716,040 B1 | 4/2004 | Martin | |
| 7,223,106 B2 * | 5/2007 | Nakajima | H01R 13/6215 411/178 |
| 7,261,592 B2 | 8/2007 | Korsunsky | |
| 7,661,965 B2 | 2/2010 | Miyoshi | |
| 7,963,775 B2 | 6/2011 | Reisinger | |
| 8,027,164 B2 * | 9/2011 | Peck | H05K 7/142 361/730 |
| 8,636,545 B2 | 1/2014 | Chow | |
| 9,343,831 B2 * | 5/2016 | Ozeki | H01R 12/7029 |
| 10,264,185 B2 * | 4/2019 | Hirabayashi | H01L 27/14609 |
| 2014/0043869 A1 | 2/2014 | Hirabayashi | |
| 2014/0301117 A1 | 10/2014 | Hirabayashi | |
| 2015/0093924 A1 | 4/2015 | Villareal | |
| 2016/0238983 A1 | 8/2016 | Hirabayashi | |
| 2018/0010739 A1 | 1/2018 | Hirabayashi | |
| 2019/0191095 A1 * | 6/2019 | Hirabayashi | H01L 27/14609 |
| 2019/0379275 A1 * | 12/2019 | Hirabayashi | G03G 15/80 |

FOREIGN PATENT DOCUMENTS

| | | |
|---|---|---|
| JP | 3563522 | 9/2004 |
| JP | 2010-267876 A | 11/2010 |
| JP | 2013-264398 A | 12/2013 |
| JP | 2014-36066 A | 2/2014 |

* cited by examiner

CIRCUIT BOARD, ELECTRONIC APPARATUS, AND IMAGE FORMING APPARATUS

CROSS-REFERENCES TO RELATED APPLICATIONS

This application is a continuation of U.S. application Ser. No. 15/614,867, filed Jun. 6, 2017, which claims priority under 35 U.S.C. § 119 to Japanese Application 2016-130903 filed in Japan on Jun. 30, 2016; and the contents of which are incorporated herein by reference as if set forth in full.

BACKGROUND OF THE INVENTION

Field of the Invention

The present invention relates to a circuit board, an electronic apparatus, and an image forming apparatus.

Description of the Related Art

In recent years, image forming apparatus have been reduced in size and increased in functionality. As a result, electrical circuits are naturally mounted at high density, and in many cases, a circuit board is divided to be arranged in remaining space in a product in order to reduce the overall size of the product. The remaining space is, for example, a minute gap immediately above one board, a gap between mechanical mechanisms, a space in the middle of a path of bundled cables, or a space just inside the exterior, that is, a location at which the product is adjacent to another apparatus when that apparatus is installed adjacent to the product. In such a case, the circuit boards are close to each other, and hence there is a fear in that noise generated at a certain circuit or member enters peripheral circuits. In particular, transformers that emit strong electromagnetic energy and high-frequency digital signals affect the peripheral circuits. Hitherto, measures against noise entrance need to be provided only to the periphery of components on the same board and adjacent patterns. However, even when boards are separated from each other, it is necessary to consider that noise generated at a board may enter another board arranged physically very close to that board. As a technology for shielding noise not in a horizontal direction but in a vertical direction with respect to a board surface as described above, a shield using a metal plate is generally used. For example, there is a method in which the frame of a product is deformed to function as a shield. However, the frame is thick to maintain its strength, and it is expensive to use the frame only for a shield for noise in terms of material and processing costs. A shield for noise only needs to be capable of shielding electric fields. Thus, in a case of a multilayer board, for example, a sufficient shielding effect is obtained when a ground pattern in which the entire region of a surface layer is subjected to conductive coating is employed. However, a shield cannot be formed on a single-sided board including a paper phenolic board (hereinafter referred to as "FR-1 board"), which is inexpensive and thus widely used.

As a shield that may be applied to such a board, for example, there is a configuration in which a flexible printed circuit connected to a ground, which is called "sub-printed wiring board", is formed on a board that is a noise source (for example, see Japanese Patent No. 3563522). With such a configuration, the board is entirely shielded. In particular, cuts or slits are formed at locations corresponding to components mounted on the surface of the board that is the noise source, and thus the sub-printed wiring board can be bonded to no-component mounted portions of the board that is the noise source without a gap. Noise can therefore be shielded.

However, in the related art, the flexible printed circuit is used as the sub-printed wiring board for shielding, which is a problem. In the rerated art, the sub-printed wiring board is made of polyimide, for example. Polyimide is generally expensive. When polyimide is used for a shield for an FR-1 board, the shield is more expensive than the FR-1 board itself. Further, the holes or the slits are formed in the sub-printed wiring board at locations corresponding to the components on the board that is the noise source, and consequently, when the arrangement of the components on the board that is the noise source is changed, the design of the sub-printed wiring board also needs to be changed. Further, the sub-printed wiring board is soldered to the ground of the board that is the noise source, and is bonded to the board that is the noise source using an adhesive. Thus, there is a problem of a large number of assembly steps.

SUMMARY OF THE INVENTION

It is an object of the present invention to take measures against noise emission in a circuit board with an inexpensive and simple configuration through application of existing components.

It is another object of the present invention to provide an electronic apparatus, including a first circuit board on which a circuit mounted, a second circuit board arranged close to the circuit on the first circuit board, and a conductive terminal, which is in contact with a ground pattern on the first circuit board, and is arranged at a location between the circuit and the second circuit board so as to extend over the circuit.

It is still another object of the present invention to provide a circuit board, including a circuit mounted on the circuit board, and a conductive terminal, which is in contact with a ground pattern on the circuit board, and is arranged at a location between the circuit and another circuit board arranged close to the circuit so as to extend over the circuit.

It is yet another object of the present invention to provide an image forming apparatus, including a frame member, an image forming portion configured to form an image, a first circuit board, which has a circuit mounted thereon, and is configured to supply voltage to the image forming portion, a second circuit board arranged close to the circuit on the first circuit board, and a conductive terminal, which is in contact with a ground pattern on the first circuit board, and is arranged at a location between the circuit and the second circuit board so as to extend over the circuit.

Further features of the present invention will become apparent from the following description of exemplary embodiments with reference to the attached drawings.

DESCRIPTION OF THE EMBODIMENTS

In the following, modes for carrying out the present invention are described in detail by way of embodiments with reference to the drawings.

First Embodiment

Now, a method of preventing noise of an electrical noise source from entering circuits and the like near the electrical noise source, thereby preventing malfunction of the peripheral circuits and conducted noise including conducted emission is described.

[Configuration of Image Forming Apparatus]

Figure 1A:
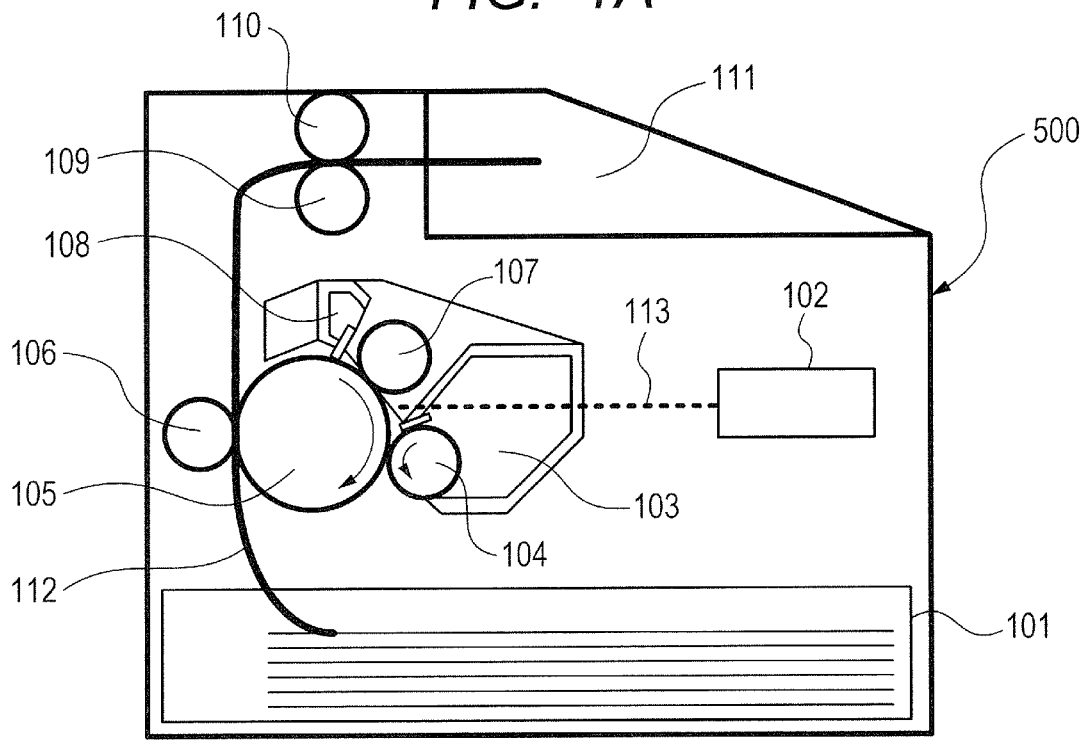
FIG. 1A is a view for illustrating the configuration of an image forming apparatus according to a first or second embodiment of the present invention.

A description is given of a laser printer that is an example of an image forming apparatus configured to form an image on a recording material. FIG. 1A is a schematic configuration view of an electrophotographic monochrome laser printer. In FIG. 1A, the body of an image forming apparatus 500 includes a sheet feeding portion 101 configured to accommodate stacked sheets to be printed. The image forming apparatus 500 includes a laser scanner (exposure device) 102, a toner tank 103 configured to store magnetic toner, a developing roller (developing device) 104, a photosensitive drum 105, a transfer roller (transfer device) 106, a charge roller (charge device) 107, a waste toner tank 108, a fixing roller 109, a pressure roller 110, a sheet discharge portion 111, a sheet conveyance path 112, and a laser optical path 113. The transfer roller 106, the photosensitive drum 105, the charge roller 107, and the developing roller 104 are applied with voltage from a high voltage power supply circuit 123 described later.

Next, the operation of the image forming apparatus is briefly described. The photosensitive drum 105 whose surface is charged to a high potential by the charge roller 107 is exposed to light by the laser scanner 102 so that an electrostatic latent image is formed on the surface. After that, toner is supplied to the electrostatic latent image by the developing roller 104, and the image is thus visualized. Then, the image is transferred onto a sheet, which is fed from the sheet feeding portion 101, with electrostatic force by the transfer roller 106, and the toner on the sheet is fixed by the fixing roller 109 and the pressure roller 110 with heat and pressure. Each roller is driven by a motor (not shown). A control device configured to control the motor and the whole operation of the image forming device is supplied with power by a low voltage power supply circuit 121 described later.

The image forming apparatus is not limited to the one exemplified in FIG. 1A, and may be, for example, an image forming apparatus including a plurality of image forming portions. In addition, the image forming apparatus may be one including a primary transfer portion in which a toner image on a photosensitive drum is transferred onto an intermediate transfer belt, and a secondary transfer portion in which the toner image on the intermediate transfer belt is transferred onto a sheet.

[Block Diagram of Image Forming Apparatus]

Figure 1B:
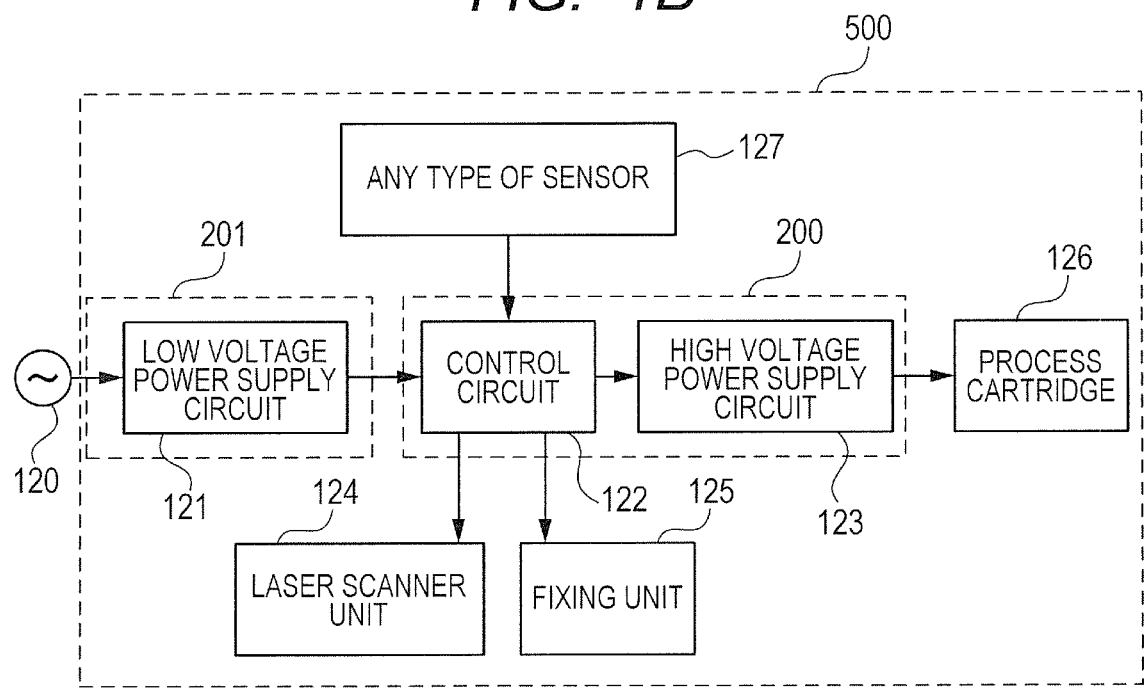
FIG. 1B is a block diagram of the image forming apparatus.

FIG. 1B is a block diagram for illustrating the entire configuration of the electrophotographic image forming apparatus 500 of the first embodiment. In FIG. 1B, the image forming apparatus 500 is connected to a commercial power source 120. The fixing unit 125 includes the fixing roller 109 and the pressure roller 110. Further, in FIG. 1A and FIG. 1B, a process cartridge 126 is a unit that allows the photosensitive drum 105, the charge roller 107, the developing roller 104, and their peripheral containers to be collectively removable. Any type of sensor 127 is mounted on a small board. The sensors 127 are arranged at some locations in the body of the image forming apparatus 500. The high voltage power supply circuit 123 configured to generate each voltage and the low voltage power supply circuit 121 configured to supply operating power are power supply circuits that occupy a large volume in the entire image forming apparatus 500. Thus, it is necessary to separately provide the high voltage power supply circuit 123 and the low voltage power supply circuit 121 to a plurality of boards in order to reduce the entire size of the product.

In such a case, the control circuit 122 that is configured to perform, for example, feedback control for the high voltage power supply circuit 123 is desirably provided on the same board as the high voltage power supply circuit 123. The control circuit 122 and the high voltage power supply circuit 123 are both mounted on a board 200, which is a first board. On the other hand, the low voltage power supply circuit 121 is mounted on a board 201. In this way, the control circuit 122, the high voltage power supply circuit 123, and the low voltage power supply circuit 121 are mounted on the board 200 and the board 201 in a divided manner. Single-sided FR-1 boards are used for the boards 200 and 201.

[Arrangement of Board]

Figure 2A:
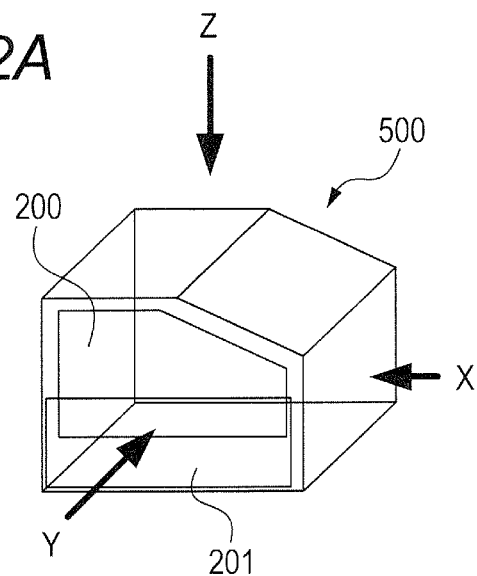
FIG. 2A, FIG. 2B, FIG. 2C, and FIG. 2D are views for illustrating the arrangement of a board of the first embodiment.
Figure 2B:
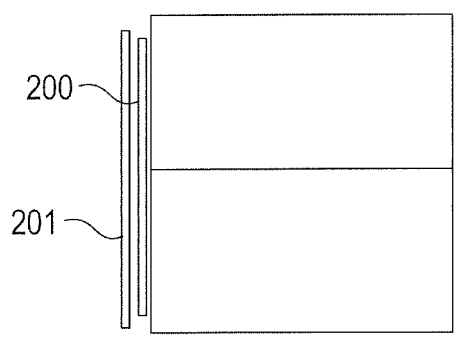
Figure 2C:
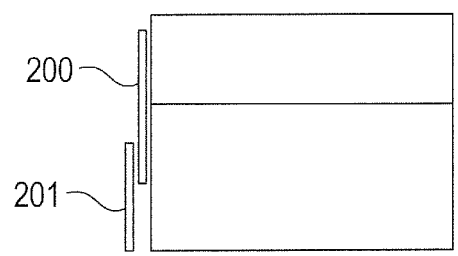
Figure 2D:
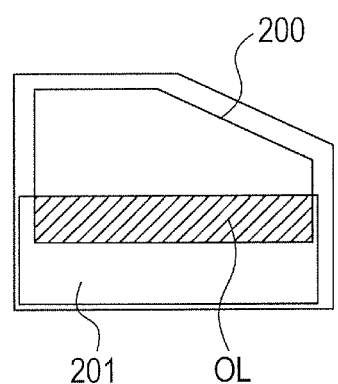

FIG. 2A is a view for illustrating the arrangement of the board 200 and the board 201, which is a second board, and FIG. 2B to FIG. 2D are views in third angle projection thereof. FIG. 2A is a perspective view of the image forming apparatus 500 that is an electronic apparatus, and FIG. 2B is a plan view of the image forming apparatus 500 when viewed from the Z direction of FIG. 2A. FIG. 2C is a front view of the image forming apparatus 500 when viewed from the X direction of FIG. 2A, and FIG. 2D is a side view of the image forming apparatus 500 when viewed from the Y direction of FIG. 2A. As can be seen from FIG. 2A to FIG. 2D, the board 201 and the board 200 are mounted on one side surface of the body of the image forming apparatus 500 so that the board 201 and the board 200 partially overlap with each other when the image forming apparatus 500 is viewed from the front. This is because mechanical mechanisms such as a gear and a motor occupy the other side surface of the body of the image forming apparatus 500.

However, with such an arrangement, electro-magnetic interference occurs in a portion OL (overlapped portion) in which the board 201 and the board 200 overlap with each other when the image forming apparatus 500 is viewed from the side as illustrated in FIG. 2D. In particular, components such as a switched capacitor, a charge pump, and a high-frequency digital circuit only include surface mount components, and hence are easy to arrange in the portion OL in which the boards overlap with each other. Meanwhile, those components have large current variations in principle, and hence are likely to emit noise. Thus, when the components such as the switched capacitor, the charge pump, and the high-frequency digital circuit are mounted on the portion OL of the board 200, those components may become noise sources for the board 201.

[Generation of Noise]

Figure 3A:
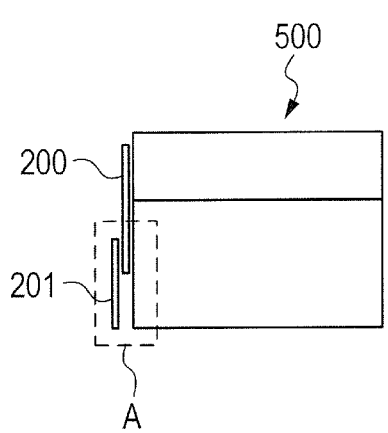
FIG. 3A, FIG. 3B, FIG. 3C, and FIG. 3D are explanatory views of noise generation in the first embodiment.
Figure 3B:
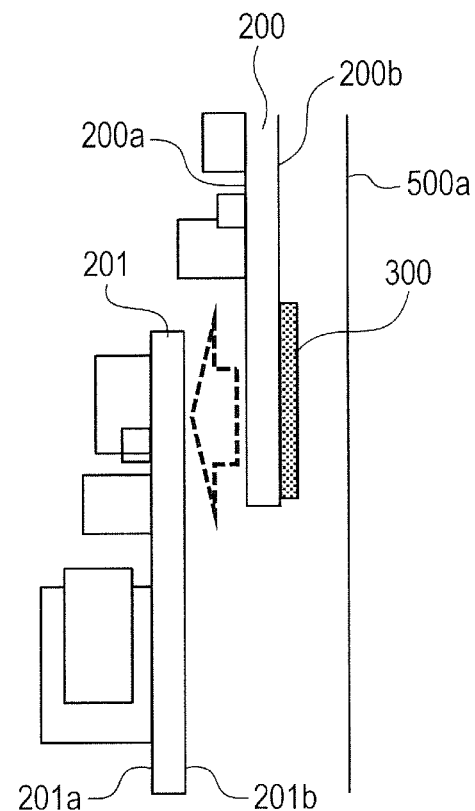
Figure 3C:
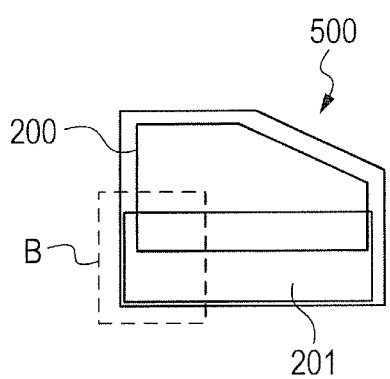
Figure 3D:
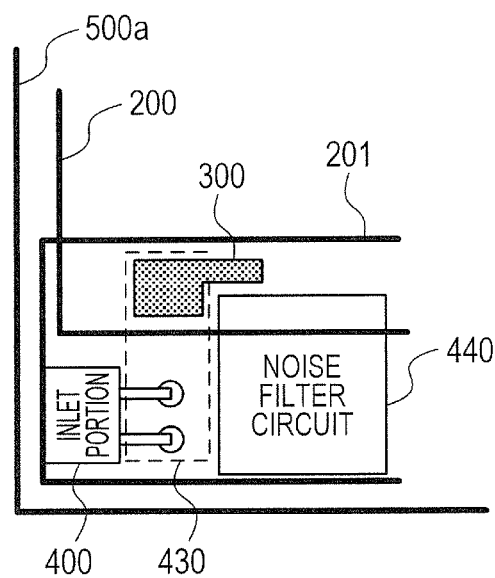

FIG. 3A to FIG. 3D are views for illustrating generation of noise. FIG. 3A is a front view of the image forming apparatus 500. FIG. 3B is an enlarged view of a broken line rectangle A of FIG. 3A. FIG. 3C is a side view of the image forming apparatus 500. FIG. 3D is an enlarged view of a broken line rectangle B of FIG. 3C. The board 200 has a component surface 200a and a solder surface 200b, and the board 201 has a component surface 201a and a solder surface 201b. As indicated by the broken arrow of FIG. 3B, when a circuit 300 that emits noise is mounted on the board 200 at a location at which the board 200 overlaps with the board 201, noise is emitted to the board 201 in a vertical direction thereof. Of the two surfaces, namely, the component surface 200a and the solder surface 200b of the board 200, the circuit 300 that is a noise generation source is mounted on the solder surface 200b. The board 201 having the low voltage power supply circuit 121 mounted thereon includes, as a measure against terminal noise, a noise filter circuit 440 between the commercial power source 120 (see FIG. 1B) and the low voltage power supply circuit 121 mounted on the board 201 (see FIG. 3D). However, the noise filter circuit 440 is a circuit provided as a measure against conducted noise. Thus, when the board 201 is entirely exposed to noise emitted from the vertical direction via a space as illustrated in FIG. 3B, the emitted noise cannot be prevented. In particular, as illustrated in FIG. 3D, a portion 430, which is indicated by the broken line, between the noise filter circuit 440 and the inlet portion 400 is weakest to the noise emitted from the vertical direction via the space. When noise is added to the portion 430, there is a fear in that the noise directly flows to the commercial power source 120, leading to an increase in terminal noise. With this configuration, it is almost impossible to take the measures using an electrical circuit. A frame member 500a is a frame member of the image forming apparatus 500.

[Ground Terminal]

Figure 4A:
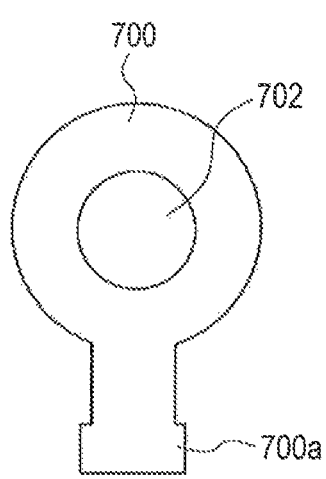
FIG. 4A and FIG. 4B are views for illustrating a ground terminal for comparison with the first embodiment.
Figure 4B:
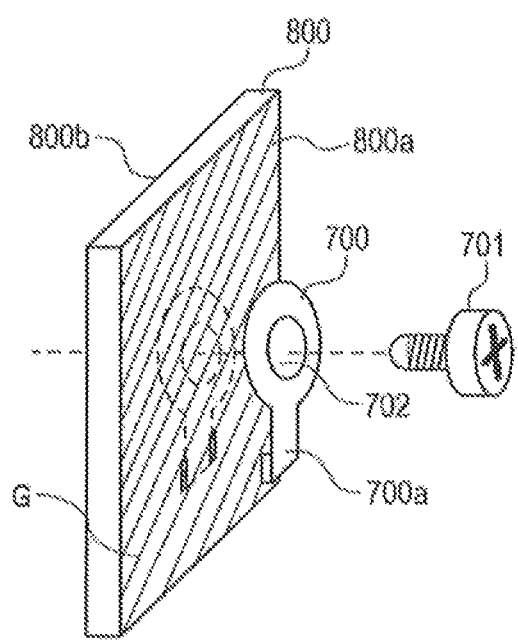

Incidentally, in an FR-1 board, a terminal component called "ground terminal" is often used. The ground terminal is a component allowing a board to be electrically connected to a frame member when the board is fixed to the frame member with a screw. FIG. 4A and FIG. 4B are views for illustrating an FR-1 board 800 and a ground terminal 700. The FR-1 board 800 has a component surface 800a and a solder surface 800b. FIG. 4A is a plan view of the ground terminal 700, and FIG. 4B is a perspective view for illustrating a state in which the ground terminal 700 is being mounted on the FR-1 board 800. The ground terminal 700 is a component formed into a circular shape and has a rectangular portion extended from part of the circular portion, for example. The ground terminal 700 has a solder portion 700a for soldering at the end portion of the rectangular portion. A hole portion 702 is formed in the circular portion of the ground terminal 700, and a screw 701 passes through the hole portion 702. As illustrated in FIG. 4B, the ground terminal 700 is sandwiched between the screw 701 and the component surface 800a of the FR-1 board 800. At this time, the ground terminal 700 is soldered to the ground pattern G on the FR-1 board 800, and the frame member 500a of the image forming apparatus 500 and the ground pattern G on the FR-1 board 800 are electrically connected to each other through the screw 701. The ground terminal 700 is a component that is often used as a unit for securely achieving electrical connection with the frame member 500a.

Ground Terminal of First Embodiment

Figure 5A:
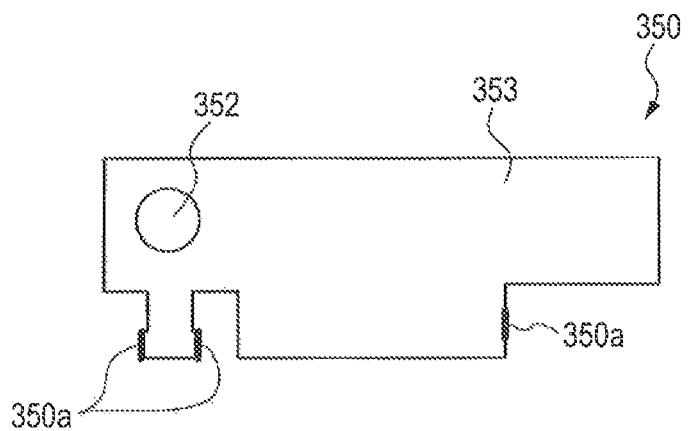
FIG. 5A, FIG. 5B, and FIG. 5C are views for illustrating a shield of the first embodiment.
Figure 5B:
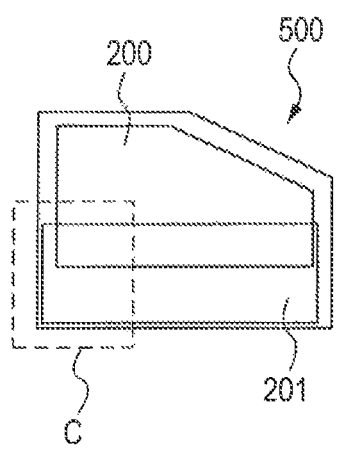
Figure 5C:
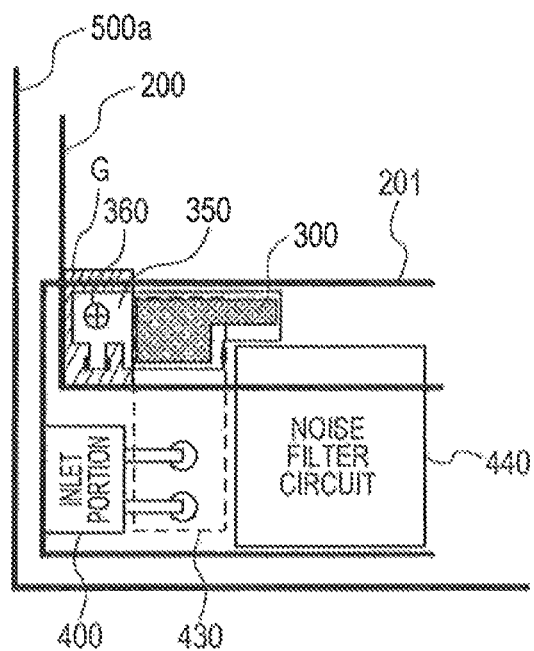

A ground terminal of the first embodiment has a shape as illustrated in FIG. 5A, which is obtained by deforming the ground terminal 700. FIG. 5A is a view for illustrating a ground terminal 350 of the first embodiment, FIG. 5B is a side view of the image forming apparatus 500, and FIG. 5C is an enlarged view of a broken line rectangle C of FIG. 5B. The ground terminal 350 of the first embodiment has a hole portion 352 through which a screw 360 passes, and solder portions 350a that are soldered to the board 200. The solder portion 350a of the ground terminal 350 of the first embodiment has a bent portion that is bent so that the solder portion 350a can be inserted into the board 200, as in the solder portion 700a of the ground terminal 700 of FIG. 4B. The board 200 has hole portions for allowing the insertion of the solder portions 350a of the ground terminal 350. The hole portions of the board 200 may be slits or round holes. The ground terminal 350 of the first embodiment has three solder portions 350a, but the number of the solder portions 350a is not limited to three.

The ground terminal 350 of the first embodiment is soldered to the board 200 at a location between the board 200 and the board 201. Further, a surface 353 of the ground terminal 350 is formed into a shape as in FIG. 5A, which is obtained by deforming the ground terminal 700, so that the surface 353 extends over at least the circuit 300 that is a noise generation source and is mounted on the board 200. The surface 353 is formed to extend over the circuit 300 that is the noise generation source in this way, and hence a shield is built between the board 200 and the board 201, which enables shielding of noise in the vertical direction. That is, in the first embodiment, the ground terminal 350, which is a metal component mounted on the board 200 and has a role other than shielding, also functions as a shielding member.

A specific description is given with reference to FIG. 5C. As described above, the ground terminal 350 is the component for electrically connecting the frame member 500a of the image forming apparatus 500 and the ground pattern G on the FR-1 board 200 to each other through the screw 360. In view of this, the ground terminal 350 is made of a material having high conductivity, for example, brass. The ground terminal 350 thus efficiently grounds an electric field, and provides a high shielding effect. Further, while the frame member 500a is made of iron having a certain thickness in order to secure its strength, the ground terminal 350 is not necessarily made of iron, and can be made of a material that is more easily processed and inexpensive than iron. In addition, as described above with reference to FIG. 4B, the ground terminal 350 is sandwiched between the screw 360 and the board 200, and is thus reduced in thickness. Consequently, when the ground terminal 350 functions as a shield, the redundancy of a usage amount of a metal material is low. Further, the solder portions 350a of the ground terminal 350 are soldered to the board 200, and hence the positional accuracy is high as compared to the case where the frame member 500a of the image forming apparatus 500 is partially deformed to build a shield between the board 200 and the board 201.

In addition, when current flows through the board 200, the temperature of the board 200 increases through heating by a resistor, a semiconductor, and the like. However, the ground terminal 350, which is soldered to the board 200, has high heat conductivity and a larger surface area than the related-art ground terminal 700, and thus functions as a heat dissipation plate of the board 200 itself. As a result, an effect of suppressing temperature rise in the entire board 200 is also provided. Thus, the solder portions 350a of the ground terminal 350 may be soldered to the board 200 so that the solder portions 350a are located near a heating element. Further, a conductive pattern from the heating element to the solder portions 350a may be increased in width, or a solid pattern may be employed. With this configuration, the effect of suppressing the temperature rise in the board 200 is enhanced.

The ground terminal 350 is exemplified in the first embodiment, but other components may be employed as long as the component is a metal plate connected to a stable voltage source. For example, there may be employed a heat dissipation plate fixed to a semiconductor component, a separated ground pattern, an element mounted on the board, or a plate-like jumper component for connecting particular power sources to each other. The heat dissipation plate, the jumper component, or the like may also be partially deformed so that when the component is mounted on the board 200, the component extends over the circuit 300 that is the noise generation source.

As described above, according to the first embodiment, it is possible to take measures against noise emission in a circuit board with an inexpensive and simple configuration through application of existing components.

Second Embodiment

Figure 6A:
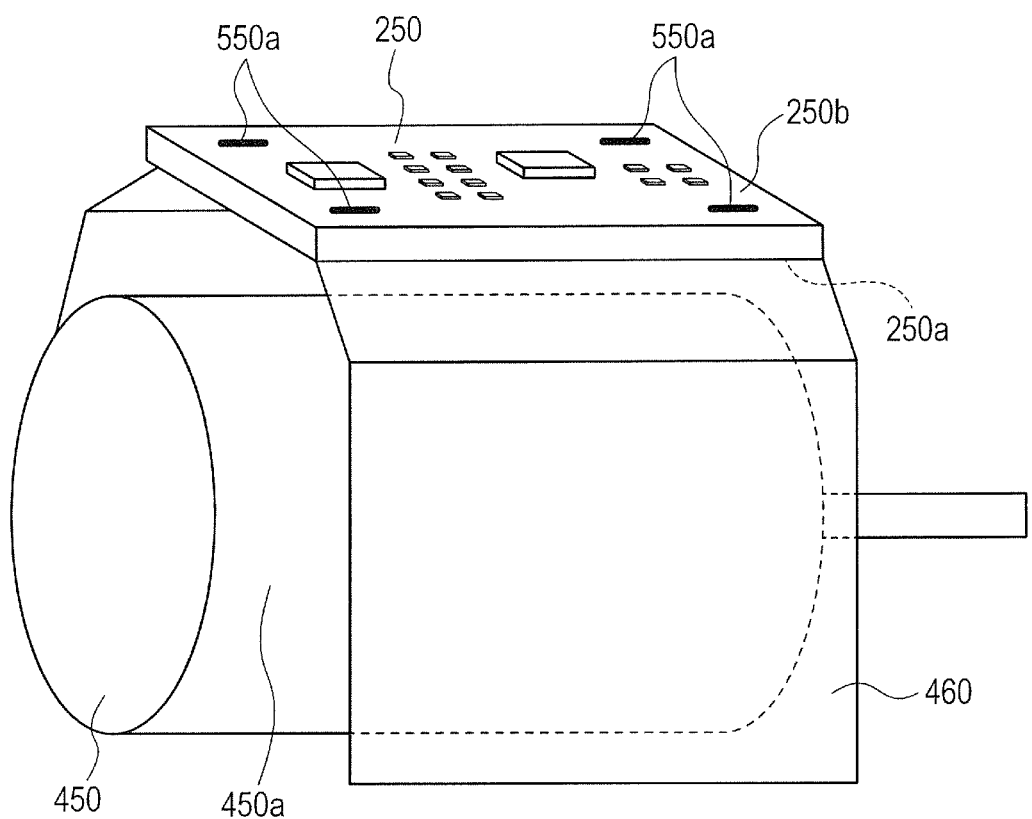
FIG. 6A and FIG. 6B are views for illustrating a shield of the second embodiment.

As a second embodiment of the present invention, a shield for a control board 250 mounted on a motor 450 as illustrated in FIG. 6A is considered. The motor 450 is a member that is a noise generation source. When being mounted on the image forming apparatus 500, the motor 450 is used to rotate the rotary members such as each roller on the sheet conveyance path 112 and the photosensitive drum 105. As products become further reduced in size, it is more difficult to build one large board into the product as described above. The main board is divided into two in the first embodiment. It is conceivable to divide the board into three or more, or arrange the control circuit for each unit at a location near each unit, for example. Here, when the control board 250 for the motor 450 is arranged immediately above the body of the motor 450 as in FIG. 6A, space utilization in the entire image forming apparatus 500 is improved, which contributes to reduction in size of the image forming apparatus 500. However, the motor 450 is a noise emission source, and hence feedback control and the like may be affected by noise when the control board 250 is in proximity to the motor 450.

Figure 6B:
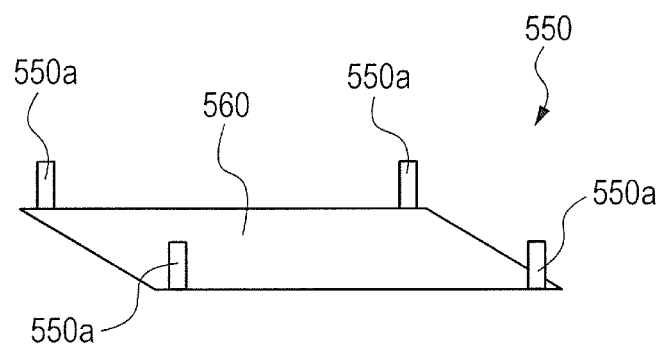

Meanwhile, on the control board 250, in order to reduce electro-magnetic interference (EMI) from the motor 450, there is provided a metal component for bringing the ground of the control board 250 and the frame member of the motor 450 into contact with each other. When such a metal component is provided, a path along which noise current flows is small as compared to a case where such a metal component is not provided. It is known that the electro-magnetic interference (EMI) in the image forming apparatus 500, which has limitations due to various specifications, can be reduced as a whole by providing such a metal component. Thus, in the second embodiment, as in the first embodiment, a metal component provided for another purpose, which is reduction of the EMI in the second embodiment, is deformed to be used as a metal component 550 functioning as a shielding member as illustrated in FIG. 6B. The control board 250 is supported by leg portions 460, for example, molds.

The metal component 550 has solder portions 550*a* that are soldered to the control board 250, and a surface 560 extended over the surface 250*a* facing the motor 450 of the control board 250. In this way, the metal component 550 provided for the purpose of reducing the EMI is deformed so that the surface 560 extends over the surface 250*a* of the control board 250 while the control board 250 is still in contact with the motor 450. As a result, the EMI is reduced and noise from the motor 450 to the control board 250 is shielded. The metal component 550 is arranged between the motor 450 and the control board 250 of FIG. 6A, and is connected to the ground pattern on the control board 250. More specifically, the metal component 550 is arranged on the surface 250*a* side of the control board 250, and the solder portions 550*a* are inserted into hole portions in, for example, lands provided on the control board 250 to be soldered on the surface 250*b* side of the control board 250. As a result, the metal component 550 extends over the control board 250, and therefore provides a shielding effect.

The entire surface of the metal component 550 may be in contact with the frame member 450*a* of the motor 450. Further, the metal component 550 may include at least one leg portion extended toward the motor 450, and the leg portion may be in contact with the frame member 450*a* of the motor 450. Further, in the second embodiment, the metal component functioning as the shielding member is connected to the ground pattern, but the metal component may be connected to a part other than the ground pattern.

As described above, according to the second embodiment, it is possible to take measures against noise emission in a circuit board with an inexpensive and simple configuration through application of existing components.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-130903, filed Jun. 30, 2016, which is hereby incorporated by reference herein in its entirety.

What is claimed is:

1. An electronic apparatus, comprising:
a first circuit board on which a first circuit to control the electronic apparatus is mounted, the first circuit board having a ground pattern and a conductive ground terminal connected to the ground pattern; and
a second circuit board arranged close to the first circuit board, the second circuit board having a second circuit to supply power to the electronic apparatus,
wherein the first circuit board and the second circuit board are arranged so that at least part of the first circuit on the first circuit board and at least part of the conductive ground terminal and at least a part of an area between the second circuit of the second circuit board and an input portion in which a voltage is input to the second circuit board, are overlapped when viewed from a direction perpendicular to the first circuit board and the second circuit board.

2. The electronic apparatus according to claim 1, further comprising a conductive frame member,
wherein the conductive ground terminal is fixed by a conductive fixing member with regard to the first circuit and the conductive frame member to be electrically connected to the first circuit and the conductive frame member.

3. The electronic apparatus according to claim 1, wherein the second circuit includes at least one of a switched capacitor, a charge pump circuit and a high-frequency digital circuit.

4. An electronic apparatus, comprising:
a first circuit board on which a first circuit to control the electronic apparatus is mounted on a first surface of the first circuit board, the first circuit board having a ground pattern and a conductive ground terminal connected to the ground pattern, the conductive ground terminal being arranged on a second surface of the first circuit board opposite the first surface; and a second circuit board arranged close to the first circuit board, the second circuit board having a second circuit to supply power to the electronic apparatus, wherein the first circuit on the first circuit board and the conductive ground terminal are arranged so that at least part of the first circuit on the first circuit board and at least part of the conductive ground terminal are overlapped when viewed from a direction perpendicular to the first circuit board, wherein the conductive ground terminal is arranged between the second surface of the first circuit board and the second circuit board, and wherein the first circuit on the first circuit board generates a radiation noise, and the conductive ground terminal reduces affection of the radiation noise to the second circuit of the second circuit board generated by the first circuit.

5. The electronic apparatus according to claim 4, further comprising a conductive frame member, wherein the conductive ground terminal is fixed by a conductive fixing member with regard to the first circuit and the conductive frame member to be electrically connected to the first circuit and the conductive frame member.

6. The electronic apparatus according to claim 4, wherein the second circuit includes at least one of a switched capacitor, a charge pump circuit and a high-frequency digital circuit.

7. A circuit board which is mounted on an electronic apparatus, comprising:

a circuit arranged on a first surface of the circuit board;

a ground pattern; and a conductive ground terminal connected to the ground pattern and arranged on a second surface of the circuit board opposite the first surface, wherein the circuit board and another circuit board mounted on the electronic apparatus are arranged close to each other, wherein at least part of the another circuit board and at least part of a portion on the circuit are overlapped at an overlapped portion when viewed from a direction perpendicular to the another circuit board and the circuit board, the portion on the circuit board including electronic components mounted on the circuit, wherein the conductive ground terminal is arranged between the overlapped portion on the another circuit board and the circuit board, and wherein the circuit generates a radiation noise, and the conductive ground terminal reduces affection of the radiation noise to the another circuit board generated by the circuit.

8. The circuit board according to claim 7, wherein the circuit includes at least one of a switched capacitor, a charge pump circuit and a high-frequency digital circuit.

9. An image forming apparatus comprising:

an image forming unit for forming an image;

a first circuit board on which a first circuit configured to operate for controlling the image forming unit is mounted, the first circuit board having a ground pattern and a conductive ground terminal connected to the ground pattern; and a second circuit board arranged close to the first circuit board, the second circuit board having a second circuit to supply power to the image forming apparatus, wherein the first circuit board and the second circuit board are arranged so that at least part of the first circuit on the first circuit board and at least part of the conductive ground terminal and at least part of an area between the second circuit of the second circuit board and an input portion in which a voltage is input to the second circuit board, are overlapped when viewed from a direction perpendicular to the first circuit board and the second circuit board.

10. The image forming apparatus according to claim 9, wherein the first circuit on the first circuit board generates a radiation noise, and the conductive ground terminal reduces affection of the radiation noise to the second circuit of the second circuit board generated by the first circuit.

11. The image forming apparatus according to claim 9, further comprising a conductive frame member, wherein the conductive ground terminal is fixed by a conductive fixing member with regard to the first circuit and the conductive frame member to be electrically connected to the first circuit and the conductive frame member.

12. The image forming apparatus according to claim 9, wherein the second circuit includes at least one of a switched capacitor, a charge pump circuit and a high-frequency digital circuit.

13. The image forming apparatus according to claim 9, wherein the first circuit board is configured to supply a high voltage to the image forming unit.

14. The image forming apparatus according to claim 9, further comprising a control unit for controlling an operation of the image forming unit, wherein the second circuit board is configured to supply a power to the control unit.

15. An image forming apparatus, comprising:

an image forming unit for forming an image;

a first circuit board on which a first circuit configured to operate for controlling the image forming unit is mounted on a first surface of the first circuit board, the first circuit board having a ground pattern and a conductive ground terminal connected to the ground pattern, the conductive ground terminal being arranged on a second surface of the first circuit board opposite the first surface; and a second circuit board arranged close to the first circuit board, the second circuit board having a second circuit to supply power to the image forming apparatus, wherein the first circuit on the first circuit board and the conductive ground terminal are arranged so that at least part of the first circuit on the first circuit board and at least part of the conductive ground terminal are overlapped when viewed from a direction perpendicular to the first circuit board, wherein the conductive ground terminal is arranged between the second surface of the first circuit board and the second circuit board, and wherein the first circuit on the first circuit board generates a radiation noise, and the conductive ground terminal reduces affection of the radiation noise to the second circuit of the second circuit board generated by the first circuit.

16. The image forming apparatus according to claim 15, further comprising a conductive frame member, wherein the conductive ground terminal is fixed by a conductive fixing member with regard to the first circuit and the conductive frame member to be electrically connected to the first circuit and the conductive frame member.

17. The image forming apparatus according to claim 15, wherein the second circuit includes at least one of a switched capacitor, a charge pump circuit and a high-frequency digital circuit.

18. The image forming apparatus according to claim 15, wherein the first circuit board is configured to supply a high voltage to the image forming unit.

19. The image forming apparatus according to claim 15, further comprising a control unit for controlling an operation of the image forming unit, wherein the second circuit board is configured to supply a power to the control unit.

* * * * *